United States Patent
Pierrat et al.

(10) Patent No.: US 6,981,240 B2
(45) Date of Patent: *Dec. 27, 2005

(54) CUTTING PATTERNS FOR FULL PHASE SHIFTING MASKS

(75) Inventors: Christophe Pierrat, Santa Clara, CA (US); Michel Luc Côté, San Jose, CA (US)

(73) Assignee: Synopsys, Inc., Mountain View, CA (US)

( * ) Notice: Subject to any disclaimer, the term of this patent is extended or adjusted under 35 U.S.C. 154(b) by 252 days.

This patent is subject to a terminal disclaimer.

(21) Appl. No.: 10/340,377

(22) Filed: Jan. 10, 2003

(65) Prior Publication Data

US 2003/0137886 A1 Jul. 24, 2003

Related U.S. Application Data

(63) Continuation-in-part of application No. 09/996,973, filed on Nov. 15, 2001, now Pat. No. 6,681,379.
(60) Provisional application No. 60/381,048, filed on May 15, 2002.

(51) Int. Cl.[7] ............................................. G06F 17/50
(52) U.S. Cl. ............................ 716/19; 716/20; 716/21; 438/241; 438/520; 438/585
(58) Field of Search ............................... 716/19, 21, 20; 430/5, 312; 438/241, 520, 585; 257/377

(56) References Cited

U.S. PATENT DOCUMENTS

| | | | |
|---|---|---|---|
| 4,037,918 A | 7/1977 | Kato | |
| 5,302,477 A | 4/1994 | Dao et al. | 430/5 |
| 5,308,741 A | 5/1994 | Kemp | 430/312 |
| 5,324,600 A | 6/1994 | Jinbo et al. | 430/5 |
| 5,364,716 A | 11/1994 | Nakagawa et al. | 430/5 |
| 5,441,834 A | 8/1995 | Takekuma et al. | |
| 5,472,814 A | 12/1995 | Lin | 430/5 |
| 5,523,186 A | 6/1996 | Lin et al. | 430/5 |
| 5,527,645 A | 6/1996 | Pati et al. | 430/5 |
| 5,537,648 A | 7/1996 | Liebmann et al. | 395/500 |
| 5,538,815 A | 7/1996 | Oi et al. | 430/5 |
| 5,565,286 A | 10/1996 | Lin | 430/5 |
| 5,573,890 A | 11/1996 | Spence | 430/311 |
| 5,595,843 A | 1/1997 | Dao | 430/5 |
| 5,620,816 A | 4/1997 | Dao | 430/5 |

(Continued)

FOREIGN PATENT DOCUMENTS

| | | |
|---|---|---|
| DE | 195 45 163 A1 | 6/1996 |
| EP | 0 653 679 A2 | 5/1995 |

(Continued)

OTHER PUBLICATIONS

Ackmann. P., et al., "Phase Shifting and Optical Proximity Corrections to Improve CD Control on Logic Devices in Manufacturing for Sub 0.35 um I–Line", SPIE, vol. 3051, pp. 146–153, Mar. 12–14, 1997.

(Continued)

*Primary Examiner*—Vuthe Siek
*Assistant Examiner*—Helen Rossoshek
(74) *Attorney, Agent, or Firm*—Bever Hoffman & Harms, LLP; Jeanette S. Harms

(57) ABSTRACT

A full phase shifting mask (FPSM) can define substantially all of the features of an integrated circuit using pairs of shifters having opposite phase. In particular, cutting patterns for working with the polysilicon, or gate, layers and active layers of static random access memory (SRAM) cells are considered. To resolve phase conflicts between shifters, one or more cutting patterns can be selected. These cutting patterns include cuts on contact landing pads. This cut simplifies the FPSM layout while ensuring greater critical dimension control of the more important features and reducing mask misalignment sensitivity.

22 Claims, 11 Drawing Sheets

U.S. PATENT DOCUMENTS

| | | | |
|---|---|---|---|
| 5,635,316 A | 6/1997 | Dao | 430/5 |
| 5,636,131 A | 6/1997 | Liebmann et al. | 364/490 |
| 5,686,223 A * | 11/1997 | Cleeves | 430/312 |
| 5,702,848 A | 12/1997 | Spence | 430/5 |
| 5,761,075 A | 6/1998 | Oi et al. | 364/498 |
| 5,766,804 A | 6/1998 | Spence | 430/5 |
| 5,766,806 A | 6/1998 | Spence | 430/5 |
| 5,786,112 A * | 7/1998 | Okamoto et al. | 430/5 |
| 5,807,649 A | 9/1998 | Liebmann et al. | 430/5 |
| 5,858,580 A | 1/1999 | Wang et al. | 430/5 |
| 5,923,562 A | 7/1999 | Liebmann et al. | 364/488 |
| 5,923,566 A | 7/1999 | Galan et al. | 364/489 |
| 5,994,002 A | 11/1999 | Matsuoka | 430/5 |
| 5,998,068 A | 12/1999 | Matsuoka | 430/5 |
| 6,057,063 A | 5/2000 | Liebmann et al. | 430/5 |
| 6,066,180 A | 5/2000 | Kim et al. | 716/19 |
| 6,083,275 A | 7/2000 | Heng et al. | 716/19 |
| 6,130,012 A | 10/2000 | May et al. | 430/5 |
| 6,139,994 A | 10/2000 | Broeke et al. | 430/5 |
| 6,185,727 B1 | 2/2001 | Liebmann | 716/19 |
| 6,228,539 B1 | 5/2001 | Wang et al. | 430/5 |
| 6,238,824 B1 | 5/2001 | Futrell et al. | |
| 6,251,549 B1 | 6/2001 | Levenson | 430/11 |
| 6,258,493 B1 | 7/2001 | Wang et al. | 430/5 |
| 6,303,251 B1 | 10/2001 | Mukai et al. | |
| 6,316,163 B1 | 11/2001 | Magoshi et al. | |
| 6,335,128 B1 | 1/2002 | Cobb et al. | 430/5 |
| 6,338,922 B1 | 1/2002 | Liebmann et al. | 430/5 |
| 6,420,074 B2 | 7/2002 | Wang et al. | 430/5 |
| 6,436,590 B2 | 8/2002 | Wang et al. | 430/5 |
| 6,467,076 B1 | 10/2002 | Cobb | |
| 6,470,489 B1 | 10/2002 | Chang et al. | |
| 6,492,073 B1 * | 12/2002 | Lin et al. | 430/5 |
| 2001/0000240 A1 | 4/2001 | Wang et al. | 430/5 |
| 2001/0028985 A1 | 10/2001 | Wang et al. | 430/5 |
| 2002/0127479 A1 | 9/2002 | Pierrat | 430/5 |
| 2002/0129327 A1 | 9/2002 | Pierrat et al. | 716/19 |
| 2002/0152454 A1 | 10/2002 | Cote et al. | 716/21 |
| 2002/0155363 A1 | 10/2002 | Cote et al. | 430/5 |

FOREIGN PATENT DOCUMENTS

| | | |
|---|---|---|
| GB | 2333613 A | 7/1999 |
| JP | 62067547 | 3/1987 |
| JP | 2-140743 | 5/1990 |
| JP | 1.283.925 | 2/1991 |
| JP | 6-67403 | 3/1994 |
| JP | 8051068 | 2/1996 |
| JP | 8-236317 | 9/1996 |
| JP | 2638561 | 4/1997 |
| JP | 2650962 | 5/1997 |
| JP | 10-133356 | 5/1998 |
| JP | 11-143085 | 5/1999 |
| WO | WO 98/12605 A1 | 3/1998 |
| WO | WO 01/23961 A1 | 4/2001 |
| WO | WO 02/03140 A1 | 1/2002 |

OTHER PUBLICATIONS

Matsuoka, K., et al., "Application of Alternating Phase–Shifting Mask to 0.16um CMOS Logic GatePatterns". Matsushita Electric Ind. Co., Ltd. (9 pages).

Wang, R., et al., "Polarized Phase Shift Mask: Concept, Design, and Potential Advantages to Photolithography Process and Physical Design", Motorola Semiconductor Sector (12 pages).

Ogawa, K., et al., "Phase Defect Inspection by Differential Interference", Lasertec Corporation (12 pages).

Pistor, T., "Rigorous 3D Simulation of Phase Defects in Alternating Phase–Shifting Masks", Panoramic Technology Inc. (13 pages).

Semmier, A., et al., "Application of 3D EMF Simulation for Development and Optimization of Alternating Phase Shifting Masks", Infineon Technologies AG (12 pages).

Wong, A., et al., "Polarization Effects in Mask Transmission", University of California Berkeley (8 pages).

Erdmann, A., "Topography Effects and Wave Aberrations in Advanced PSM–Technology", Fraunhofer Institute of Integrated Circuits (11 pages).

Granik, Y., et al., "CD Variation Analysis Technique and its Application to the Study of PSM Mask Misalignment", Mentor Graphics (9 pages).

Hanyu, et al., "New Phase–Shifting Mask with Highly Transparent SiO2 Phase Shifters", Fujitsu Laboratories Ltd. (11 pages).

Ishiwata, N., et al., "Fabrication of Phase–Shifting Mask", Fujitsu Limited (11 pages).

Levenson, M., et al., "Phase Phirst! An Improved Strong–PSM Paradigm", M.D. Levenson Consulting, Petersen Advanced Lithography, KLA–Tencor (10 pages).

Levenson, M., et al., "SCAA Mask Exposures and Phase Phirst Design for 110nm and Below", M.D. Levenson Consulting. Canon USA, Inc., JSR Microelectronics, Inc. (10 pages).

Lin, B.J., "The Relative Importance of the Building Blocks for 193nm Optical Lithography", Linnovation, Inc. (12 pages).

McCallum, M., et al., "Alternating PSM Mask Performance—a Study of Multiple Fabrication Technique Results", International SEMATECH (6 pages).

Morikawa, Y., et al., "100nm–alt.PSM Structure Discussion for ArF Lithography", Dai–Nippon Printing Co., Ltd. (15 pages).

Ozaki, T., et al., "A 0.15um KrF Lithography for 1Gb DRAM Product Using Highly Printable Patterns and Thin Resist Process", Toshiba Corporation (2 pages).

Rhyins, P., et al., "Characterization of Quartz Etched PSM Masks for KrF Lithography at the 100nm Node", Photronics, Inc., MIT Lincoln Lab, ARCH Chemicals, Finle Technologies, KLATencor Corp. (10 pages).

Rosenbluth, A., et al., "Optimum Mask and Source Patterns to Print a Given Shape", IBM (17 pages).

Schmidt, R., et al., "Impact of Coma on CD Control for Multiphase PSM Designs", AMD, ASML (10 pages).

Sewell, H., et al., "An Evaluation of the Dual Exposure Technique", SVG Lithography Systems Inc. (11 pages).

Spence, C., et al., "Optimization of Phase–Shift Mask Designs Including Defocus Effects", AMD, Princeton University, Vecor Technologies Inc. (8 pages).

Suzuki, A., et al., "Multilevel Imaging System Realizing k1—.3 Lithography", Canon Inc. (13 pages).

Vandenberghe, G., et al., "(Sub–)100nm Gate Patterning Using 248nm Alternating PSM", IMEC, Mentor Graphics (9 pages).

Fritze, M., et al., "100–nm Node Lithography with KrF?", MIT Lincoln Lab, Numberical Technologies, Photronics, Arch Chemicals (14 pages).

Fukuda, H., et al., "Patterning of Random Interconnect Using Double Exposure of Strong–Type PSMs", Hitachi Central Research Lab (8 pages).

Ferguson, R., et al., "Pattern–Dependent Correction of Mask Topography Effects for Alternating Phase–Shifting Masks", IBM Microelectronics, University of California Berkeley (12 pages).

Toublan, O., et al., "Phase and Transmission Errors Aware OPC Solution for PSM: Feasibility Demonstration", Mentor Graphics Corp. (7 pages).

Yanagishita, Y., et al., "Phase–Shifting Photolithography Applicable to Real IC Patterns", Fujitsu Limited (11 pages).

Levenson, M., et al., "Improving Resolution in Photolithography with a Phase–Shifting Mask", IEEE, Transactions On Electron Devices, vol. ED–29, No. 12, pp. 1828–1836, Dec. 1982.

Levenson, M., et al., "The Phase–Shifting Mask II: Imaging Simulations and Submicrometer Resist Exposures", IEEE Transactions on Electron Devices. vol. ED–31, No. 6, pp. 753–763, Jun. 19894.

Terasawa, T., et al., "0.3–Micron Optical Lithography Using a Phase–Shifting Mask", SPIE, Optical/Laser Microlithography II. vol. 1088, pp. 25–33, Mar. 1989.

Nitayama, A., et al., "New Phase Shifting Mask with Self-Aligned Phase Sifters for a Quarer Micron Photolithography", IEDM, pp. 3.3.1–3.3.4, Dec. 3–6, 1989.

Jinbo, H., et al., "0.2um or Less i–Line Lithography by Phase–Shifting–Mask Technology", IEEE, pp. 33.3.1–33.3.4 (1990).

Neureuther, A., "Modeling Phase Shifting Masks", SPIE, 10th Annual Symposium On Microlithography, vol. 1496, pp. 80–85 (1990).

Yamanaka, T., et al., "A 5.9um2 Super Low Power SRAM Cell Using a New Phase–Shift Lithography", IEDM, pp. 18.3.1–18.3.4 (1990).

Inokuchi, K., et al., "Sub–Quarter Micron Gate Fabrication Process Using Phase–Shifting–Mask for Microwave GaAs Devices", Extended Abstracts Of The 1991 Intl. Conference On Solid State Devices And Materials, Yokohama, Japan, pp. 92–94 (1991).

Inokuchi, K., et al., "Sub–Quarter–Micron Gate Fabrication Process Using Phase–Shifting Mask for Microwave GaAs Devices", Japanese Journal Of Applied Physics, vol. 30, No. 12B, pp. 3818–3821, Dec. 1991.

Jinbo, II., et al., "Improvement of Phase–Shifter Edge Line Mask Method", Japanese Journal Of Applied Physics, vol. 30, No. 11B, pp. 2998–3003, Nov. 1991.

Kimura, T., et al., "Subhalf–Micron Gate GaAs Mesfet Process Using Phase–Shifting–Mask Technology", IEEE, GaAs IC Symposium, pp. 281–284 (1991).

Wiley, J., et al., "Phase Shift Mask Pattern Accuracy Requirements and Inspection Technology", SPIE, Integrated Circuit Metrology, Inspection, And Process Control V, vol. 1464, pp. 346–355 (1991).

Hirai, Y., et al., "Automatic Pattern Generation System for Phase Shifting Mask", 1991 Symposium on VLSI Technology, Digest of Technical Papers, pp. 95–96, May 28–30, 1991.

Wong, A., et al., "Investigating Phase–Shifting Mask Layout Issues Using a Cad Toolkit", IEEE, pp. 27.4.1–27.4.4 (1991).

Terasawa, T., et al., "Imaging Characteristics of Multi–Phase–Shifting and Halftone Phase–Shifting Masks", Japanese Journal of Applied Physics, vol. 30, No. 11B, pp. 2991–2997, Nov. 1991.

Burggraaf, P., "Four More Significant Japanese Advances in Phase Shifting Technology", Semiconductor International, p. 16, Dec. 1991.

Kemp, K., et al., "Optimized Phase Shift Mask Designs for Real Devices", KTI Microlithography Seminar, pp. 67–75, Oct. 14–15, 1991.

Newmark, D., et al., "Phase–Shifting Mask Design Tool", SPIE—11th Annual Bacus Symposium on Photmask Technology, vol. 1604, pp. 226–235, Sep. 25–27, 1991.

Nolscher, C., et al., "Investigation of Self–Aligned Phase–Shifting Reticles by Simulation Techniques", SPIE—Optical/Laser Microlithography IV, vol. 1463, pp. 135–150 (1991).

Inoue, S., et al., "Simulation Study on Phase–Shifting Masks for Isolated Patterns", Japanese Journal of Applied Physics, vol. 30, No. 11B, pp. 3010–3015, Nov. 1991.

Watanabe, H., et al., "Detection and Printability of Shifter Defects in Phase–Shifting Masks", Japanese Journal of Applied Physics, vol. 30, No. 11B, pp. 3016–3020, Nov. 1991.

Watanabe, H., et al., "Pattern Transfer Characteristics of Transparent Phase Shifting Mask", Japanese Journal of Applied Physics, vol. 30, No. 11B, pp. 3004–3009, Nov. 1991.

Jinbo, H., et al., "Application of Blind Method to Phase–Shifting Lithography", IEEE, 1992 Symposium On VLSI Technology Digest Of Technical Papers, pp. 112–113 (1992).

Watanabe, II., et al., "Detection and Printability of Shifter Defects in Phase–Shifting Masks II Defocus Characteristics", Jpn. J. Appl. Phys., vol. 31, pp. 4155–4160 (1992).

Pierrat, C., et al., "Phase–Shifting Mask Topography Effects on Lithography Image Quality", IEEE, pp. 3.3.1–3.3.4 (1992).

Burggraaf, P., "Lithography's Leading Edge, Part I: Phase–Shift Technology and Part 2: I–Line and Beyond", Semiconductor International, pp. 43–47 and 52–56, Feb. 1992.

IBM, "Phase–Shift Mask Utilizing Silicon Oxy–Nitride as a Low Reflectivity Phase–Shift Layer," IBM Technical Disclosure Bulletin, vol. 34, No. 10B, pp. 360–361, Mar. 1992.

Brunner, T., et al., "170nm Gates Fabricated by Phase–Shift Mask and Top Anti–Reflector Process", SPIE, Optical/Laser Microlithography VI, Vo. 1927, pp. 182–189 (1993).

Lin, B.J., "Phase–Shifting Masks Gain an Edge", IEEE Circuits & Devices, pp. 28–35, Mar. 1993.

Moniwa, A., et al., "Algorithm for Phase–Shift Mask Design with Priority on Shifter Placement", Jpn. J. Appl. Phys., vol. 32, Pt. 1, No. 12B, pp. 5874–5879, Dec. 1193.

Ooi, K., et al., "Computer Aided Design Software for Designing Phase–Shifting Masks", Jpn. J. Appl. Phys., vol. 32, Pt. 1, No. 12B, pp. 5887–5891, Dec. 1993.

Ohtsuka, H., et al., "Evaluation of Repair Phase and Size Tolerance for a Phase–Shift Mask", J. Vac. Sci. Technol. B, vol. 11, No. 6, pp. 2665–2668, Nov./Dec. 1993.

Ronse, K., et al., "Comparison of Various Phase Shift Strategies and Applications to 0.35um ASIC Designs", SPIE—Optical/Laser Microlithography VI, vol. 1927, pp. 2–16 (1993).

Galan, G., et al., "Application of Alternating–Type Phase Shift Mask to Polysilicon Level for Random Logic Circuits", Jpn. J. Appl. Phys., vol. 33, pp. 6779–6784 (1994).

Mizuno, F., et al., "Practical Phase–Shifting Mask Technology for 0.3µm Large Scale Integrations", J. Vac. Sci. Technol. B, vol. 12, No. 6, pp. 3799–3803, Nov./Dec. 1994.

Pati, Y.C., et al., "Phase–Shifting Masks for Microlithography: Automated Design and Mask Requirements", J. Opt. Soc. Am., vol. 11, No. 9, pp. 2438–2452, Sep. 1994.

Stirniman, J., et al., "Wafer Proximity Correction and Its Impact on Mask–Making", Bacus News, vol. 10, Issue 1, pp. 1, 3–7, 10–12, Jan. 1994.

Waas, T., et al., "Automatic Generation of Phase Shift Mask Layouts", Microelectronic Engineering, vol. 23, pp. 139–142 (1994).

Barouch, E., et al., "OPTIMASK: An OPC Algorithm for Chrome and Phase–Shift Mask Design", SPIE, Vo. 2440, pp. 192–206, Feb. 1995.

Moniwa, A., et al., "Heuristic Method for Phase–Conflict Minimization in Automatic Phase–Shift Mask Design", Jpn. J. Appl. Phys., vol. 34, Pt. 1, No. 12B, pp. 6584–6589, Dec. 1995.

Langston, J., et al., "Extending Optical Lithography to 0.25um and Below", Solid State Technology, pp. 57–64, Mar. 1995.

Nagahiro, Y., "Improve Mask Technique for Photolithography Applied to 0.25um LSI—Improvement of Resolution, Pattern Correction, Exposure Area", Nikkei Microdevices, pp. 1–6, Apr. 1995.

Okamoto, Y., et al., "A New Phase Shifting Mask Technology for Quarter Micron Photolithography", SPIE, vol. 2512, pp. 311–318 (1995).

Pierrat, C., et al., "Required Optical Charcteristics of Materials for Phase–Shifting Masks", Applied Optics, vol. 34, No. 22, pp. 4923–4928, Aug. 1, 1995.

Galan, G., et al., "Alternating Phase Shift Generation for Coplex Circuit Designs", SPIE, vol. 2884, pp. 508–519, Sep. 18–20, 1996.

Kanai, H., et al., "Sub–Quarter Micron Lithography with the Dual–Trench Type Alternating PSM", SPIE, vol. 2793, pp. 165–173 (1996).

Ishiwata, N., et al., "Novel Alternating Phase Shift Mask with Improved Phase Accuracy", SPIE, Proceedings Of The 17th Annual Symposium On Photomask Technology And Management, vol. 3236, pp. 243–249 (1997).

Morimoto, H., et al., "Next Generation Mask Strategy— Technologies are Ready for Mass Production of 256DRAM?", SPIE, vol. 3236, pp. 188–189 (1997).

Roman, B., et al., "Implications of Device Processing on Photomask CD Requirements", SPIE, vol. 3236 (1997) (Abstract Only).

Nakae, A., et al., "A Proposal for Pattern Layout Rule in Application of Alternating Phase Shift Mask", SPIE, vol. 3096, pp. 362–374 (1997).

Tsujimoto, E., et al., "Hierarchical Mask Data Design System (PROPHET) for Aerial Image Simulation, Automatic Phase–Shifter Placement, and Subpeak Overlap Checking", SPIE, vol. 3096, pp. 163–172 (1997).

Yamamoto, K., et al., "Hierarchical Processing of Levenson–Type Phase Shifter Generation", Jpn. J. Appl. Phys., vol. 36, Part I, No. 12B, pp. 7499–7503, Dec. 1997.

Gordon, R., et al., "Design and Analysis of Manufacturable Alternating Phase–Shifting Masks", Bacus News, vol. 14, Issue 12, pp. 1–9, Dec. 1998.

Nara, M., et al., "Phase Controllability Improvement for Alternating Phase Shift Mask", Dai Nippon Printing Co., Lul. (16 pages).

Ohnuma, H., et al., "Lithography Computer Aided Design Technology for Embedded Memory in Logic", Jpn. J. Appl. Phys., vol. 37, Part 1, No. 12B, pp. 6686–6688, Dec. 1998.

Fukuda, H., "Node–Connection/Quantum Phase–Shifting Mask: Path to Below 0.3um Pitch, Proximity Effect Free, Random Interconnects and Memory Patterning", J. Vac. Sci. Technol. B, vol. 17, No. 6, pp. 3291–3295, Nov./Dec. 1999.

Spence, C., et al., "Integration of Optical Proximity Correction Strategies in Strong Phase Shifters Design for Poly–Gate Layers", Bacus News, vol. 15, Issue 12, pp. 1, 4–13, Dec. 1999.

Kuo, C.., et al., "Extension of Deep–Ultraviolet Lithography for Patterning Logic Gates Using Alternating Phase Shifting Masks", J. Vac. Sci. Technol. B, vol. 17, No. 6, pp. 3296–3300, Nov./Dec. 1999.

Palmer, S., et al., "Dual Mask Model–Based Proximity Correction for High Performance 0.10um CMOS Process", The 44th Int'l Conference on Electron, Ion & Photon Beam Tech. and Nanofabrication Abstracts, pp. 18–19, May 30–Jun. 2, 2000.

Pierrat, C., "Investigation of Proximity Effects in Alternating Aperture Phase Shifting Masks", Numerical Technologies, Inc. (11 pages).

Kikuchi, K., et al., "Method of Expanding Process Window for the Double Exposure Technique with alt–PSMs". Optical Microlithography XIII, Proceeding of SPIE, vol. 4000, pp. 121–131 (2000).

Cooke, M., "OPC/PSM Designs For Poly Gate Layers", European Semiconductor, vol. 22, No. 7, pp. 57–59, Jul. 2000.

Granik, Y., et al., "Sub–Resolution Process Windows And Yield Estimation Technique Based On Detailed Full–Chip CD Simulation", SPIE, vol. 4182, pp. 335–341 (2000).

Plat, M., et al., "The Impact of Optical Enhancement Techniques on the Mask Error Enhancement Function (MEEF)", SPIE, vol. 4000, pp. 206–214, Mar. 1–3, 2000.

Mansuripur, M., et al., "Projection Photolithography", Optics & Photonics News 11, 17 pages, Feb. 2000.

* cited by examiner

CUTTING PATTERNS FOR FULL PHASE SHIFTING MASKS

RELATED APPLICATION

This application is a non-provisional of claims the benefit of priority of, and incorporates by reference, the U.S. patent application Ser. No. 60/381,048 filed 15 May 2002, entitled "Phase Shifting Design and Layout for Static Random Access Memory", having inventors Christophe Pierrat and Michel Luc Côté, and assigned to the assignee of the present invention.

This application is a continuation-in-part of, claims the benefit of priority of, and incorporates by reference, the U.S. patent application Ser. No. 09/996,973 now U.S. Pat. No. 6,681,379, filed 15 Nov. 2001, and issued Jan. 20, 2004, entitled "Phase Shifting Design And Layout For Static Random Access Memory", having inventors Christophe Pierrat and Michel Côté, and assigned to the assignee of the present invention.

BACKGROUND OF THE INVENTION

1. Field of the Invention

The present invention relates to manufacturing small dimension features for integrated circuits using photolithographic masks. More particularly, the present invention relates to cutting patterns for full phase shifting masks that can implement dense layouts, such as static random access memory (SRAM) layouts.

2. Description of the Related Art

A standard binary mask includes a patterned opaque (e.g. chrome) layer formed on a transparent (e.g. quartz) substrate. The pattern can be transferred onto the wafer using optical lithography. Specifically, for each layer of the integrated circuit design, a radiation (e.g. light) source is shone on the mask (wherein the term mask can also refer herein to a reticle) corresponding to that layer. This radiation passes through the transparent regions of the mask and is blocked by the opaque regions of the mask, thereby selectively exposing a photoresist layer on the wafer. After development of the photoresist layer, the underlying semiconductor layer no longer covered by photoresist can be removed by etching, thereby transferring the desired pattern onto the wafer. This process can be repeated for each layer of the integrated circuit design on the wafer.

In a phase shifting mask (PSM), complementary phase shifters (also called shifters) are configured such that the exposure radiation transmitted by one shifter is approximately 180 degrees out of phase with the exposure radiation transmitted by the other shifter (often referred to a 0- and 180-degree phase shifters for convenience). Therefore, rather than constructively interfering and merging into a single image, the projected images destructively interfere where their edges overlap, thereby creating a clear and very small low intensity image between the pair of shifters. This low intensity image generally represents a feature on the layout.

For example, in one embodiment, the shifters can be used to print critical features of a layout. These critical features can be user-defined and could include the gates of transistors. See, for example, U.S. Pat. No. 5,858,580. In one embodiment, this PSM can be used in conjunction with a trim mask that defines other features of the layout, e.g. interconnects, etc.

In another embodiment, shifters can be formed on a full phase shifting mask (FPSM), which can define substantially all of the desired features for a layer, thereby providing small features on substantially all of the layer, a region of a layer, etc. These small features can significantly improve speed and performance compared to both binary masks and PSMs. The FPSM can be used in conjunction with a trim mask that can remove the areas left unexposed by the FPSM.

Defining dense designs with a FPSM can result in a significant increase in phase conflicts in the FPSM layout. One type of phase conflict occurs when two shifters intended to define a feature, and thus should have opposite phase, have the same phase. If these shifters are assigned the same phase, then they will not result in the optical interference necessary to create the desired feature. Thus, the shifters need to be cut, or split, in such a way as to allow the relevant layout features to be defined using the phase shifters.

Unfortunately, proximate shifters (e.g. one shifter in each pair) of opposite phase can generate an artifact, i.e. an undesirable feature, not in the layout. This artifact must be cleared using the trim mask.

FIG. 1 illustrates a FPSM layout 100 including a line 101 that is proximate and perpendicular to a line 102. An exemplary shifter pattern that can define lines 101 and 102 is shown. Specifically, shifters 105 and 106 can define line 101 whereas shifters 103 and 104 can define line 102. Note that shifters 103 and 106 are approximately 180 degrees out of phase with shifters 104 and 105 (indicated by the different orientation of the cross-hatching), thereby providing the necessary optical interference to define lines 101 and 102. Further note that a FPSM layout would include only the shifters. Lines 101 and 102 are shown in FIG. 1 for context in relation to the shifters and would be of the same material as the darker stippled areas of mask 100.

Of importance, a cut 107 can be provided to resolve the potential phase conflict caused by shifters 104 and 106. Specifically, cut 107 is formed so that shifters 104 and 106, which are of opposite phase, are not abutting. In this cutting pattern, a complementary trim mask (not shown) can define the line end of line 101. See, e.g. U.S. patent application Ser. No. 09/932,239, having inventors Christophe Pierrat, et. al., entitled "Phase Conflict Resolution for Photolithographic Masks", filed 17 Aug. 2001, and assigned to the assignee of the present application, which is incorporated herein by reference. Unfortunately, because the desired width of shifter 104 is reduced (see cut 107), some loss of critical dimension (CD) control for line 102 can occur. Moreover, the complementary trim mask must be carefully aligned with the FPSM implementing FPSM layout 100 to ensure that the end of line 101 is correctly defined.

Therefore, a need arises for a technique that simplifies the FPSM layout while ensuring critical dimension control and reducing mask misalignment sensitivity.

SUMMARY OF THE INVENTION

A full phase shifting mask (FPSM), which can define substantially all of the desired features for an integrated circuit (IC) layer using shifters, can improve IC speed and performance compared to both binary masks and PSMs. In accordance with one aspect of the invention, positioning shifters for a FPSM includes using one or more cutting patterns to provide critical dimension (CD) control and reduce mask misalignment sensitivity.

A dense circuit, such as a circuit implementing a SRAM, can be particularly challenging to define using full phase shifting. For example, one portion of a SRAM cell that is difficult to define using phase sifting looks generally like two T's with off-centered lines opposing each another. In this configuration, contacts can be implemented at the ends of the lines and four transistors can be implemented on either end of the top of the T's. In some SRAM designs, the lines are bent to allow even denser packing of the transistor gates. However, this design does not change the topology of the pattern or the general implementation described herein.

In accordance with one aspect of the invention, a plurality of shifters can be placed in a FPSM layout to define a plurality of SRAM cells using destructive light interference. The plurality of shifters can be separated by cuts according to one or more cutting patterns. In one embodiment, a single cutting pattern can be selected for all SRAM cells in the FPSM layout. In another embodiment, multiple cutting patterns can be used for various portions of the FPSM layout. Although four cutting patterns for a polysilicon layer are described, the layout may include patterns other than SRAM cells, e.g. CPU cores, standard cells, I/O blocks, random logic, etc.

A first cutting pattern can include a first cut between two contact landing pads of each SRAM cell, and a second cut and a third cut on inside corners of a T of each SRAM cell opposite the first cut. A second cutting pattern can include a first cut between two contact landing pads of each SRAM cell and a second cut on the back of the T of each SRAM cell to the back of the T of an adjacent SRAM cell. A third cutting pattern can include a first cut and second cut from contact landing pads of the SRAM cell to a field area of the SRAM cell and a third cut on the back of the T of the SRAM cell to the back of the T of an adjacent SRAM. A fourth cutting pattern can include a first cut and a second cut in opposing inside corners of the T of each SRAM cell to a contact corner.

In one embodiment, corresponding features from one SRAM memory cell to another can be defined using the same phase ordering. For example, if the shifter on the left of a given transistor is phase 0 and the one on the right is 180, then it may be desirable to ensure that the shifter on the left of the corresponding transistor on another SRAM memory cell is 0 and the one on the right is 180. This phase ordering ensures consistency in the SRAM memory cell layout, even if there is a light intensity imbalance between 0 and 180 degree shifters.

In accordance with another aspect of the invention, a plurality of shifters can be placed in a FPSM layout to define a plurality of active regions in the SRAM cells. In one embodiment, the plurality of active regions are shaped as O's, I's, and H's. Again, as with the polysilicon, or gate layer, different SRAM designs may have slightly different active layer patterns. A cutting pattern for an O-shaped feature can include a cut dividing the O-shaped feature in half. A cutting pattern for an I-shaped feature can include a first cut between two left-side line ends of horizontal bars of the I-shaped feature and a second cut between two right-side line ends of the horizontal bars. In one embodiment, a third cutting pattern can be provided between the I-shaped feature and the O-shaped feature. The third cutting pattern can include a cut between a vertical bar of the I-shaped feature and the cut dividing the O-shaped feature.

In accordance with another aspect of the invention, a mask set can be fabricated using the FPSM layout. The mask set can include the FPSM and a trim mask, which is used in conjunction with the FPSM. Specifically, the trim mask preserves structure defined by the FPSM as well as clear artifacts created by use of the FPSM, and defines any remaining edges, portions of edges, or structures not defined by the FPSM.

DETAILED DESCRIPTION OF THE FIGURES

Figure 1:
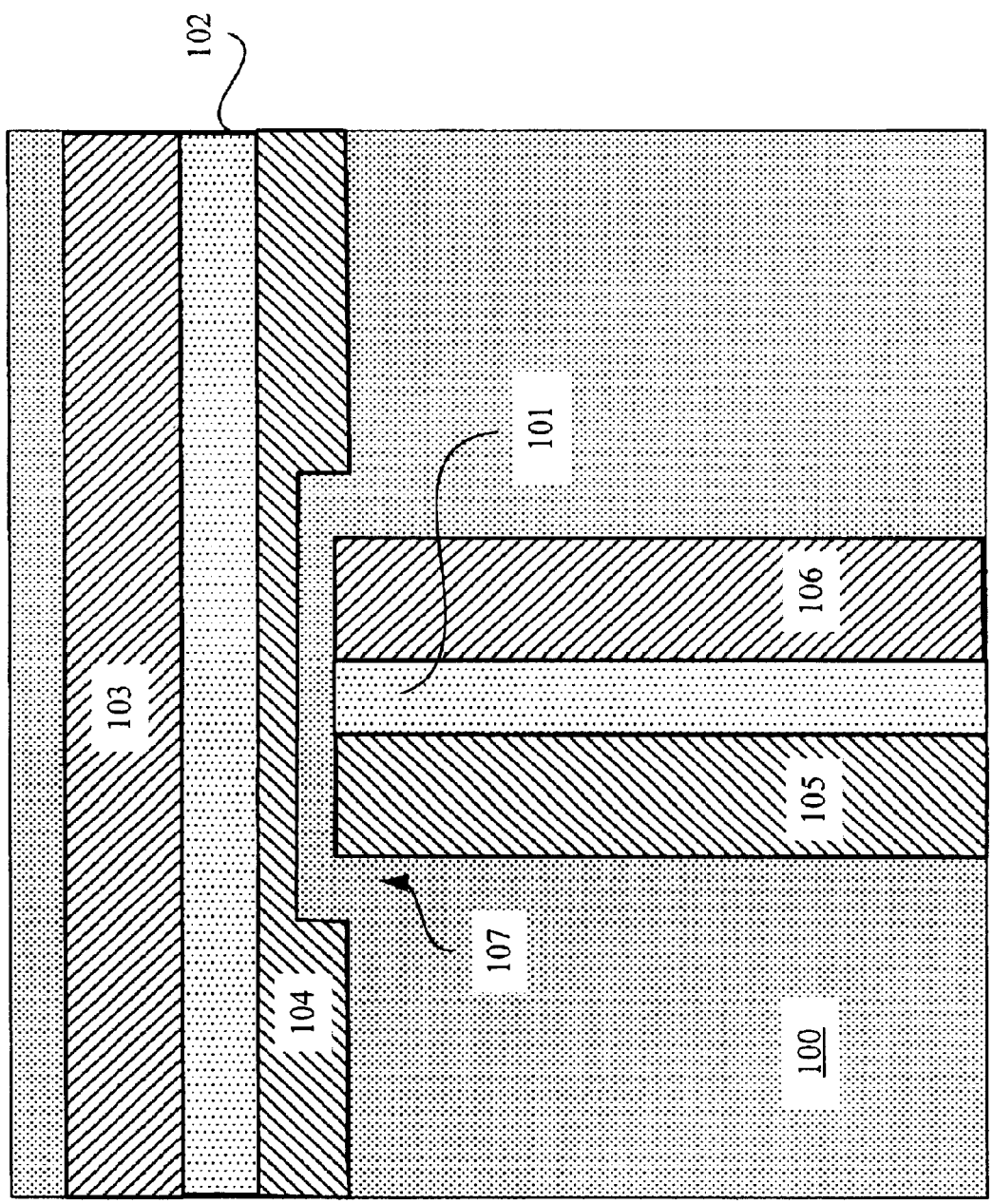
FIG. 1 illustrates a prior art phase shifting layout for a line end perpendicular and proximate to a line.

A dense circuit, such as a circuit implementing a SRAM, can be particularly challenging to define using full phase shifting. For example, one portion of a SRAM cell that is difficult to define using phase sifting looks generally like two T's with off-centered lines opposing each another. In this configuration, contacts can be implemented at the ends of the lines and four transistors can be implemented on either end of the top of the T's. In some instances, the lines for the contacts are bent to allow denser packing, the description and patterns herein can be suitably adapted to such SRAM configurations.

In accordance with one aspect of the invention, a plurality of shifters can be placed in a FPSM layout to define a plurality of SRAM cells using destructive light interference. The plurality of shifters can be separated by cuts according to one or more cutting patterns. These cutting patterns share a common feature. Specifically, an exemplary FPSM layout 200, shown in FIG. 2, can include a cut 204 at the side in the end of line 101. FPSM layout 200 can include a shifter 202 that can substantially define edges of both lines 101 and 102. Specifically, shifters 202 and 203 can define line 101 whereas shifters 201 and 202 can define line 102. Note that shifters 201 and 203 are approximately 180 degrees out of phase with shifter 202, thereby providing the necessary optical interference to define lines 101 and 102.

Advantageously, this side cut pattern is less sensitive to mask set misalignment. For example, if the FPSM mask implementing FPSM layout 200 is slightly misaligned with its corresponding trim mask, line 101 (including the end of line 101) and line 102 are still defined solely by the FPSM. Therefore, any potential adverse effect based on the misalignment of the trim mask can be reduced.

Moreover, this side cut pattern can also provide better CD control for line 102. Specifically, adjacent to line 102, shifters 201 and 202 can be formed at substantially full width, i.e. with the exception of one shifter width (corresponding to shifter 203). In contrast, the end cut pattern of FPSM layout 100 results in significant width reduction, i.e. two shifter widths and one line width (corresponding to shifters 105/106 and line 101). Therefore, the side cut pattern advantageously minimizes the size of cuts, reduces mask set misalignment problems, and provides better CD control for line 102.

Figure 2:
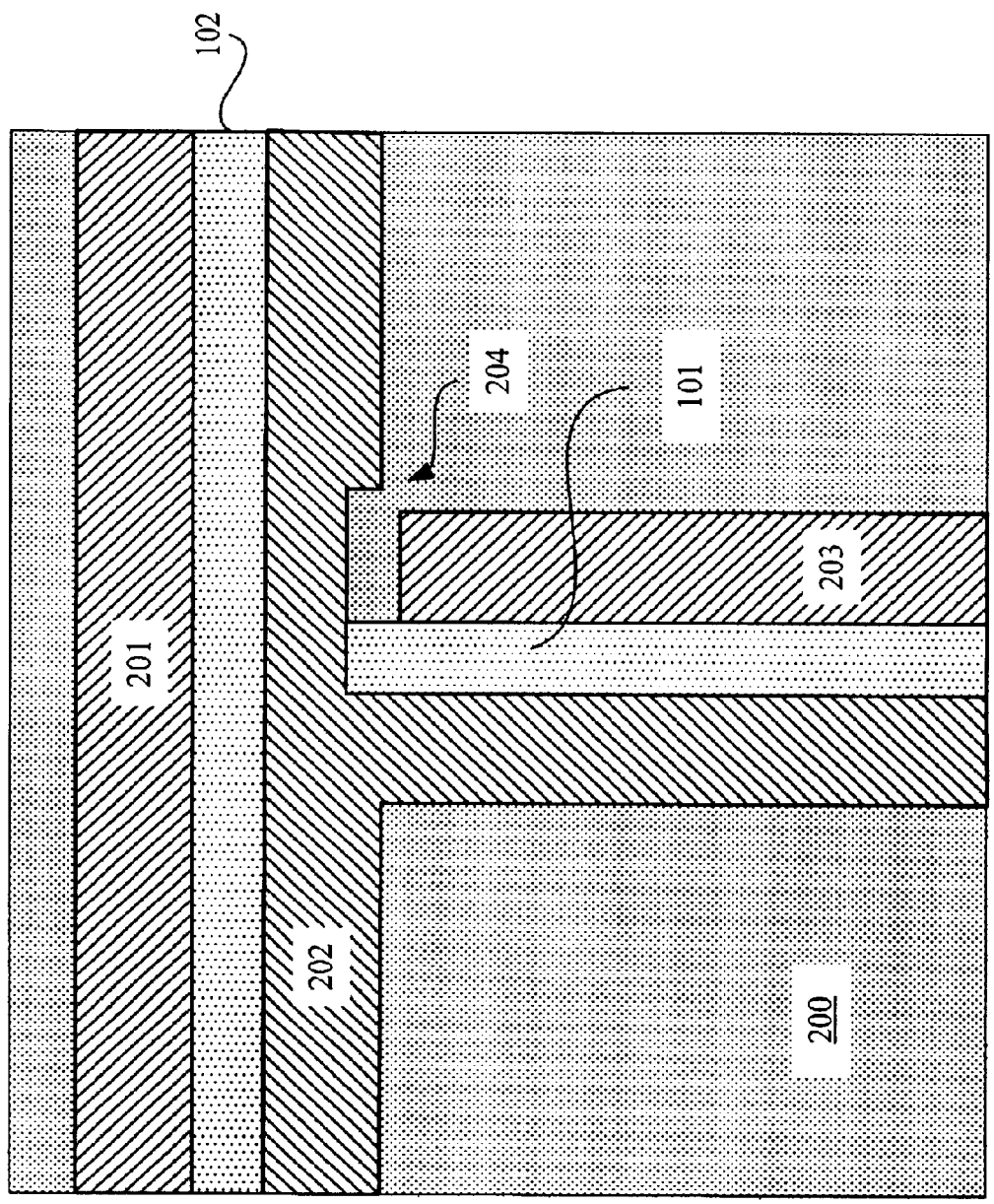
FIG. 2 illustrates a simplified phase shifting layout for a first line end perpendicular and proximate to a second line. The simplified phase shifting layout includes a cut on the side of the first line end, thereby reducing sensitivity to mask misalignment as well as ensuring better critical dimension control for the second line.

Note that critical dimension control in the area of the line end of line 101 is assumed to be less critical than the width of line 102. If this is not true, then the pattern shown in FIG. 1 may be more preferable. For example, and shown in FIG. 3, line ends 301 are present in a similar configuration as seen in FIG. 1 and FIG. 2 for a static random access memory (SRAM) layout 300. Thus, having slightly less CD control at these areas is acceptable. In contrast, the active regions of transistors could correspond to areas 302 in SRAM layout 300. Thus, having CD control in areas 302 is important for device performance. Note that SRAM layout 300 is representative of common designs and includes a largely repeating pattern including a portion 310 which is surrounded by a dashed line, which will be considered in later figures. Thus, although the subsequent embodiments refer to FPSM layouts for SRAMs, the line end side cut pattern of FIG. 2 is equally applicable to other integrated circuit designs.

FIGS. 4–7 illustrate various cutting patterns for a FPSM layout that can define polysilicon features of an SRAM cell. These cutting patterns advantageously include cuts made in the contact landing pads, thereby reducing sensitivity to mask set misalignment and improving CD control.

Figure 3:
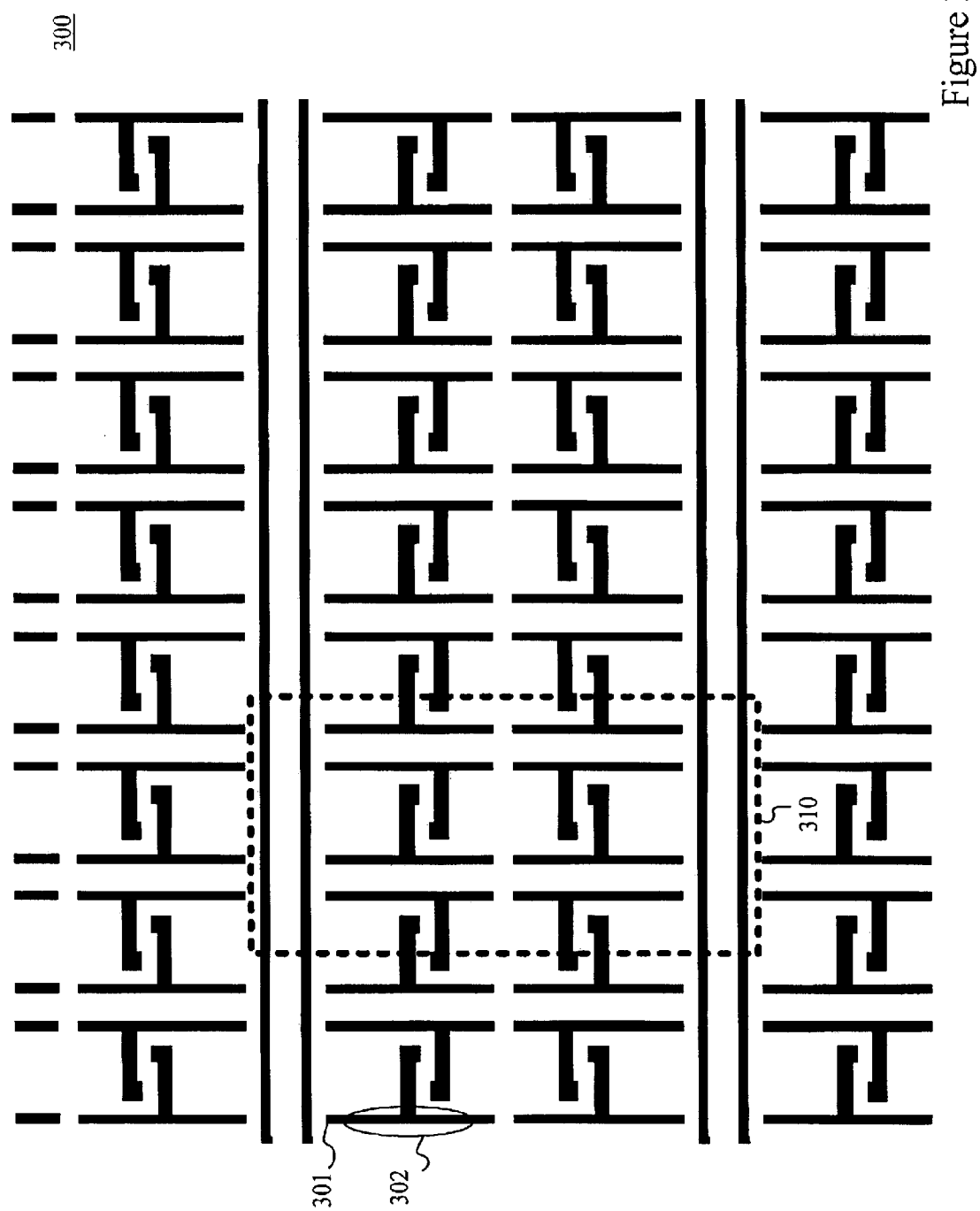
FIG. 3 illustrates an exemplary polysilicon layout for a static random access memory (SRAM).
Figure 4:
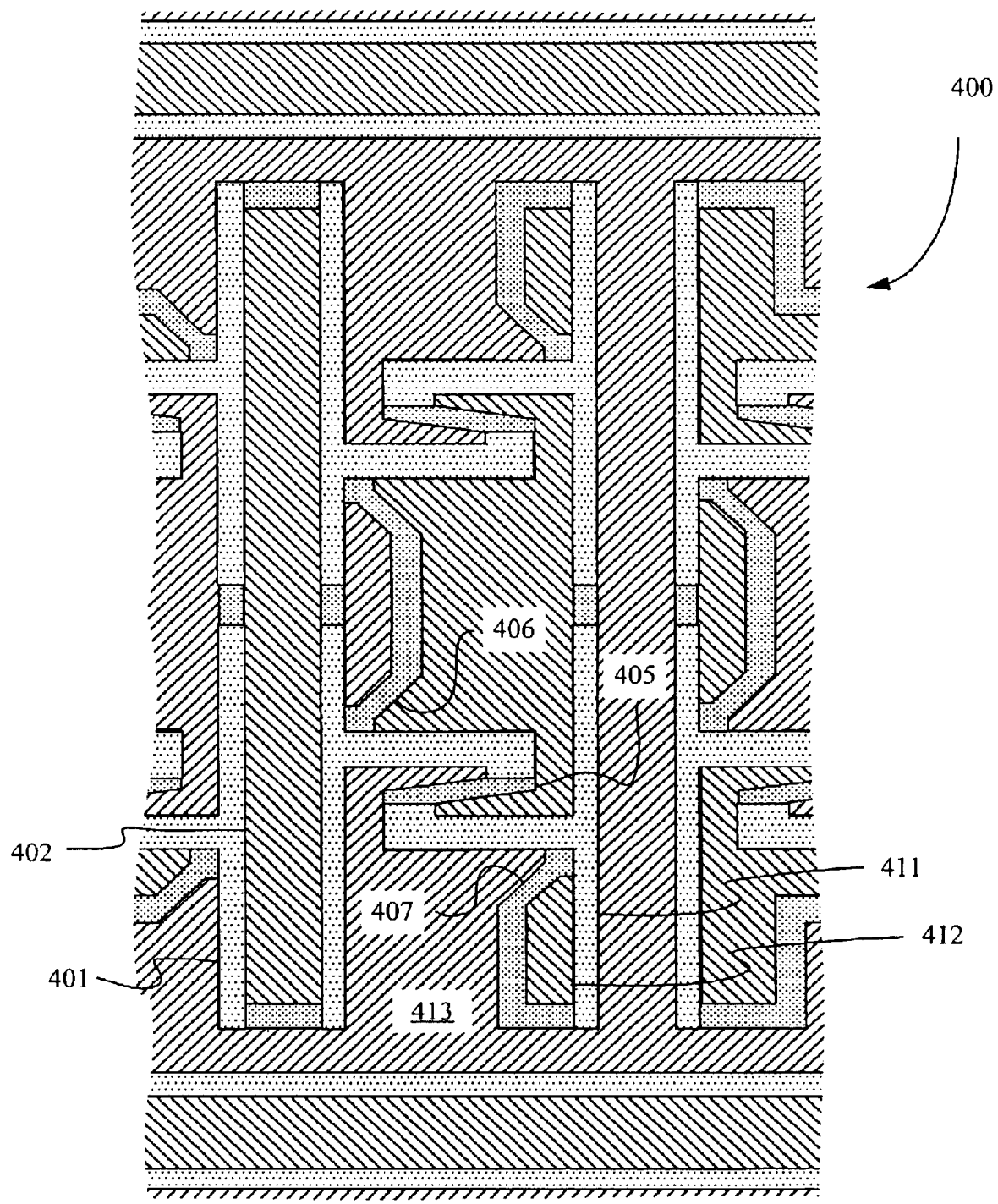
FIG. 4 illustrates a first cutting pattern in a FPSM layout that can define polysilicon features of an SRAM cell using different shifter ordering. The first cutting pattern includes a cut between two contact landing pads as well as cuts in the inside corners of the T's opposite the cuts between the contacts that extend to the ends of the T's.

FIG. 4 illustrates a first cutting pattern in a FPSM layout 400 for the portion 310 of FIG. 3 that can define polysilicon features of an SRAM cell. Specifically, the first cutting pattern used in FPSM layout 400 includes a cut 405 between two contact landing pads as well as cuts 406 and 407 in the inside corners of the T's opposite the cuts between the contacts that extend to the ends of the T's. In FPSM layout 400, the first cutting pattern can cause similar features, e.g. features 401 and 411, to be defined by a different shifter ordering, e.g. (X, X+180) and (X+180, X), as seen by the cross hatching on shifters 402, 412, and 413.

Unfortunately, because there can be a light intensity imbalance between shifters of opposite phase (e.g. 0 and 180degree shifters), this ordering may cause similar features to print slightly differently depending on where they are located within the larger pattern of the memory array. Specifically, if the 0 degree shifter is slightly more intense than the 180 degree shifter then the light imbalance will tend to move features slightly towards the 180 degree shifter. Therefore, if the phase ordering is flipped from feature to similar feature, then some features may print slightly to one side and other similar features may print slightly to the other side. Thus, it may be desirable to ensure that the cutting pattern used to define the individual memory cells of the SRAM can define similar features using the same shifter ordering.

Figure 5:
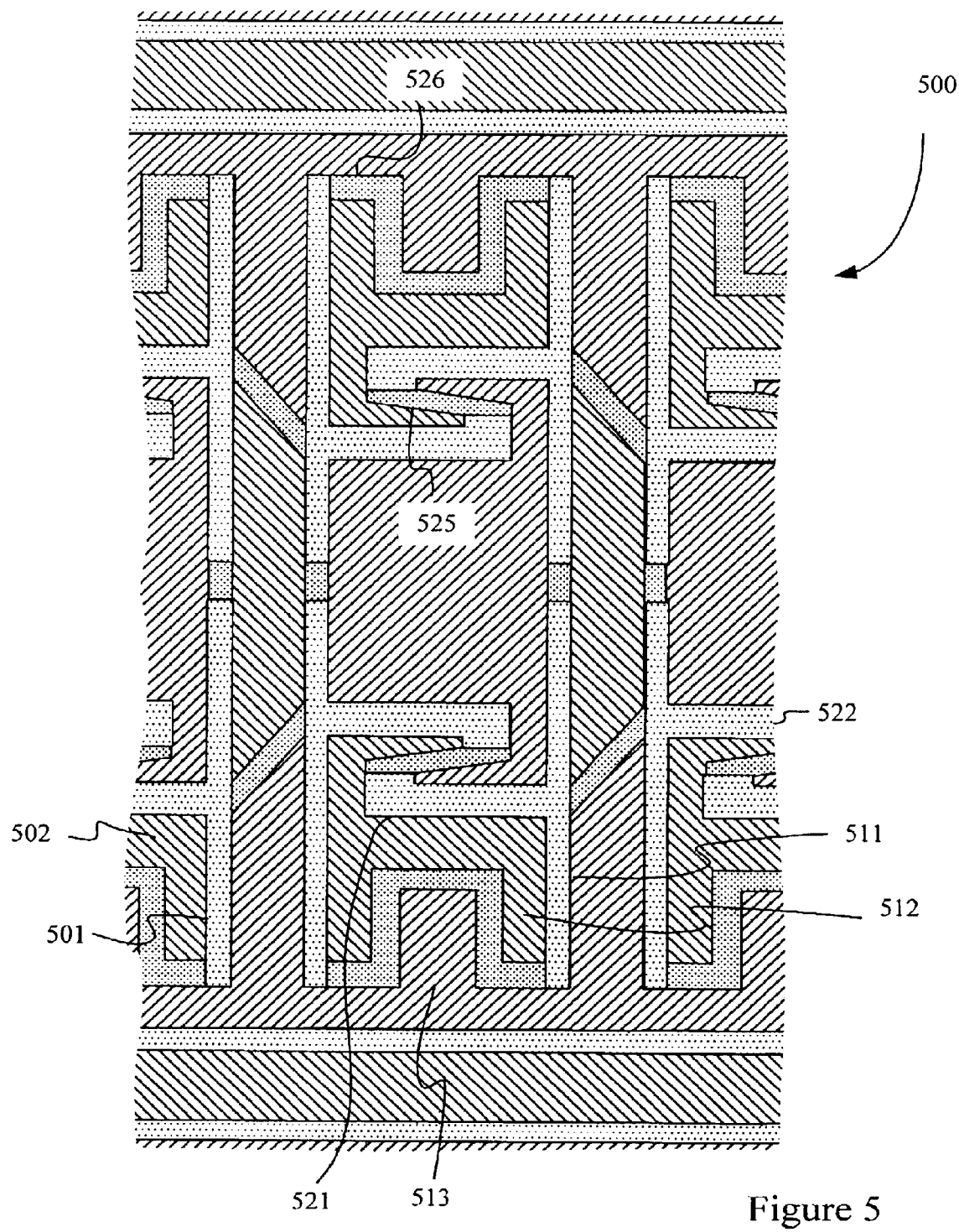
FIG. 5 illustrates a second cutting pattern in a FPSM layout that defines similar features using the same shifter ordering. The second cutting pattern includes cuts between the two contact landing pads as well as cuts on the backs of the T's that extend to the backs of the adjacent T's.

The second cutting pattern shown in a FPSM layout 500 of FIG. 5 (for the portion 310 of FIG. 3) defines similar features using the same shifter ordering. For example, similar features, e.g. features 501 and 511, are consistently defined using the same phase orderings, as seen by the cross hatching on shifters 502, 512, and 513. The second cutting pattern used in FPSM layout 500 includes a cut 525 between the two contact landing pads as well as a cut 526 on the back of the T that extend to the back of an adjacent T.

It should also be noted that in some memory designs, the lines associated with contact areas of adjacent memory cells can be aligned. For example, instead of providing both vertical and horizontal offsets between lines 521 and 522, these lines could be in vertical alignment. This alignment, which could be used in other FPSM layouts (e.g. FIG. 6), would impact the cutting patterns by facilitating the use of straight line cuts between adjacent memory cells. See, for example, FIGS. 1 and 3 of "A Novel Approach to Simulate the Effect of Optical Proximity on MOSFET Parametric Yield,", A. Balasinki, et. al., IEEE March 1999, for an example of an SRAM cell with aligned horizontal lines. However, irrespective of cutting shape, the fundamental cutting patterns can still be used.

Figure 6:
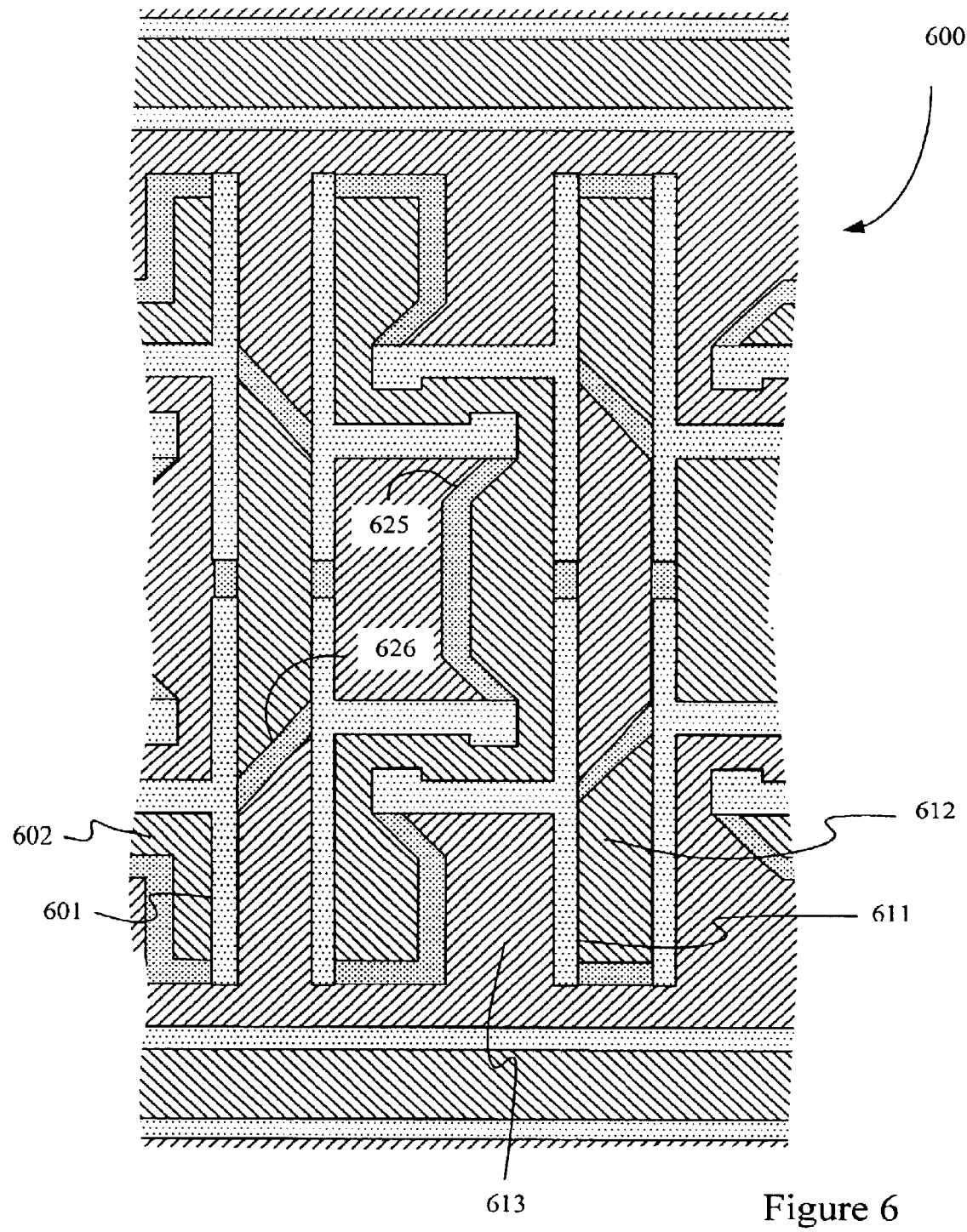
FIG. 6 illustrates a third cutting pattern in a FPSM layout that provides an alternating shifter ordering. The third cutting pattern includes cuts in the contact landing pads to the field as well as cuts on the back of the T's to the backs of the adjacent T's.

FIG. 6 illustrates a third cutting pattern in a FPSM layout 600 (for the portion 310 of FIG. 3) that provides an alternating shifter ordering for similar areas. Specifically, features 601 and 611 are defined using different phase ordering, as seen by the cross hatching on shifters 602, 612, and 613. However, this order can be repeated with other similar pairs of features. In other words, the shifter ordering is apparent when adjacent similar features are paired. The third cutting pattern used in FPSM layout 600 includes a cut 625 in the contact landing pads to the field as well as a cut 626 on the back of the T to the back of an adjacent T.

Figure 7:
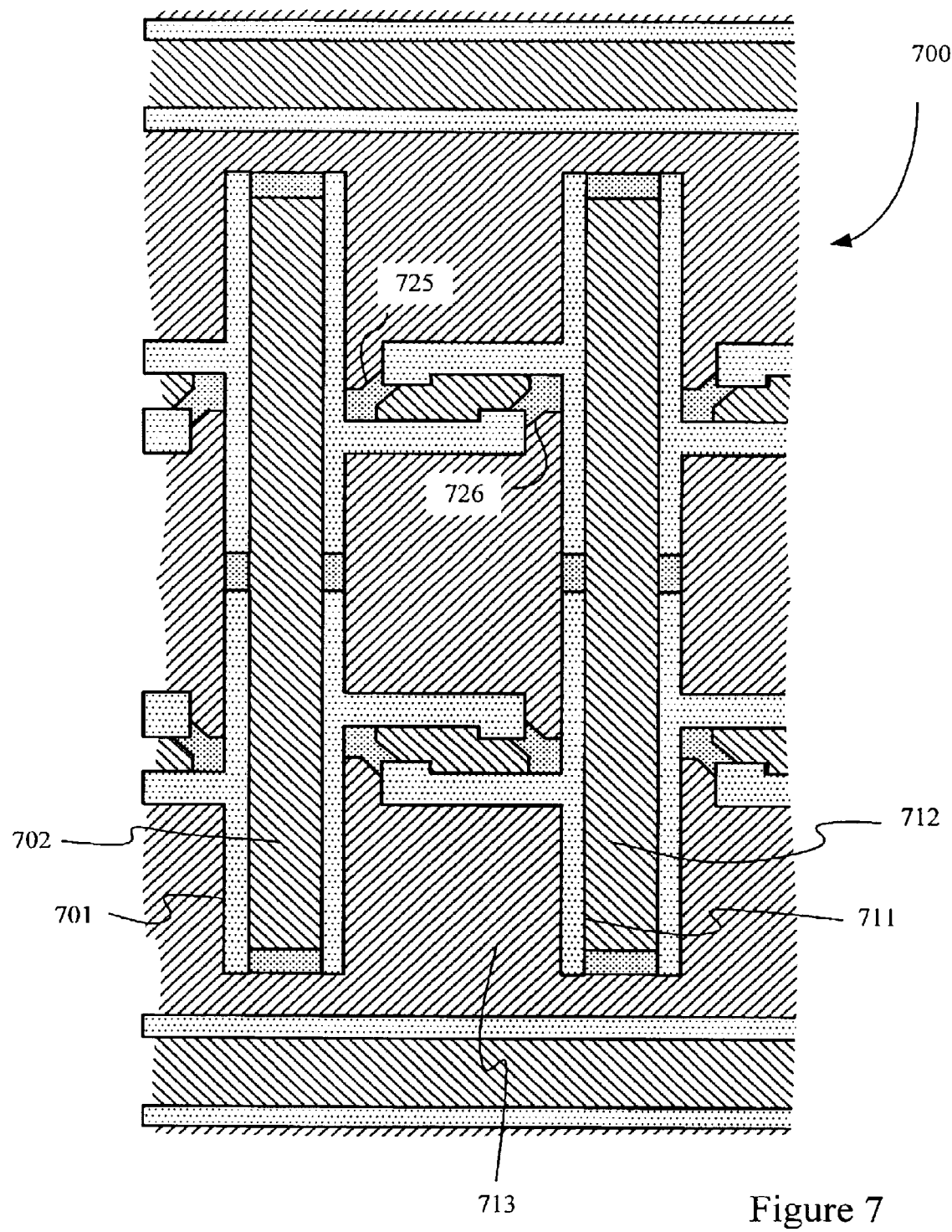
FIG. 7 illustrates a fourth cutting pattern in a FPSM layout that defines similar features using the same shifter ordering. The fourth cutting pattern includes cuts in the opposing inside corners of the T's to the corners of the contacts.

FIG. 7 illustrates a fourth cutting pattern in a FPSM layout 700 (for the portion 310 of FIG. 3) that defines similar features using the same shifter ordering. Specifically, features 701 and 711 are defined using the same phase ordering, as seen by the cross hatching on shifters 702, 712, and 713. The fourth cutting pattern used in FPSM layout 700 includes cuts 725 and 726 in the opposing inside corners of the T's to the corners (as opposed to sidewalls) of the contacts.

Note that the selected cutting pattern (i.e. at least one of the first, second, third, and fourth cutting patterns) can depend on mask manufacturability concerns, the process design rules, and/or one or more simulations of the cutting pattern for a given SRAM design and lithographic process.

Figure 8:
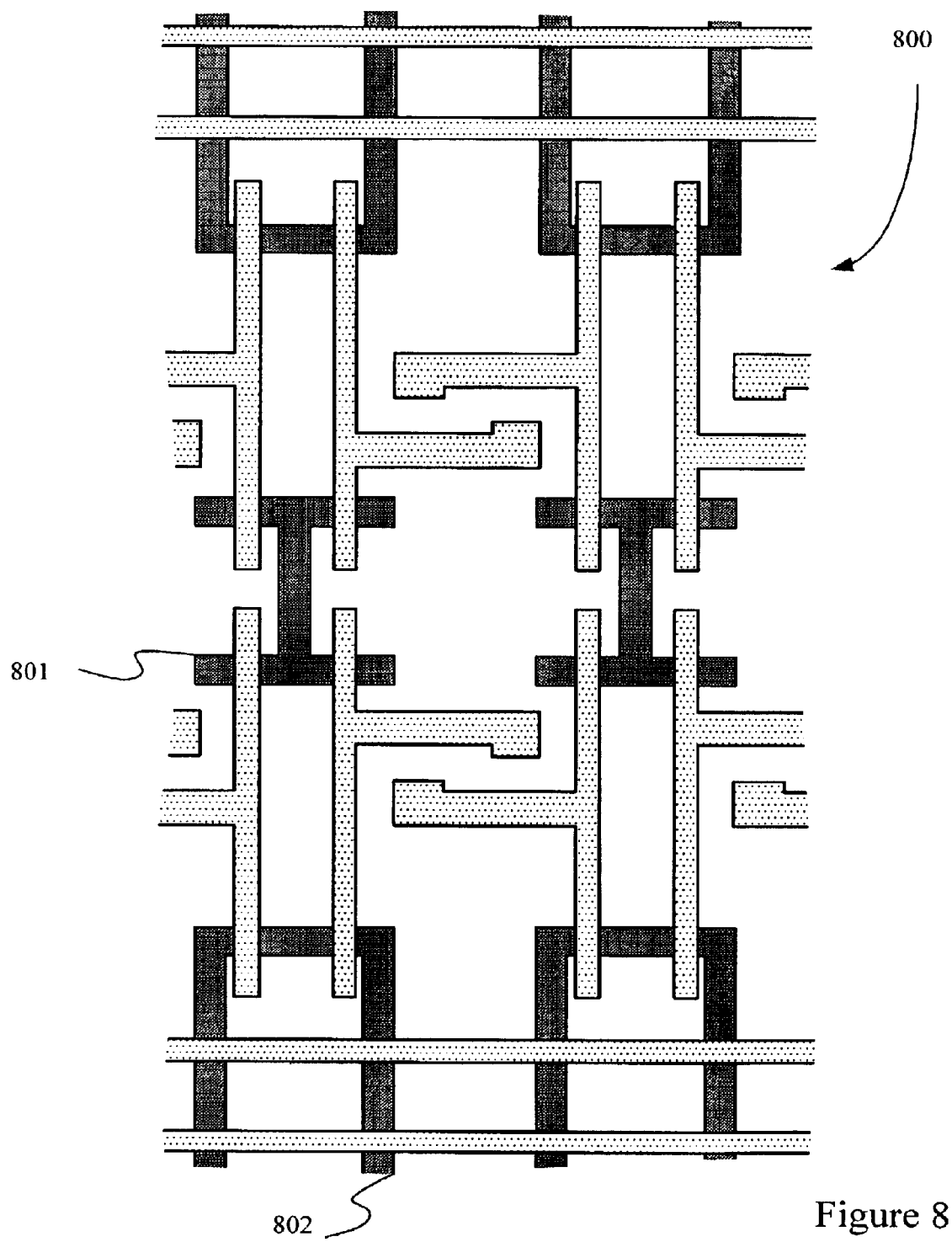
FIG. 8 illustrates a composite layout for implementing an SRAM memory cell array. The composite layout includes a polysilicon layer layout superimposed on an active layer layout. In this embodiment, features in the active layer can be implemented using I shapes and O shapes.

FIG. 8 illustrates a composite layout 800 for implementing an SRAM memory cell array (for the portion 310 of FIG. 3). Composite layout 800 includes a polysilicon, or gate, layer layout (indicated by a sparse dotted fill pattern) superimposed on an active (i.e. diffusion) layer layout (indicated by a dense dotted fill pattern). Note that the active layer layout can include alternating rows of different shapes. For example, in one embodiment, one row can include I's (see shape 801) and another row can include O's (see shape 802). The two layers overlap in the area of the gates on the polysilicon layer.

Figure 9:
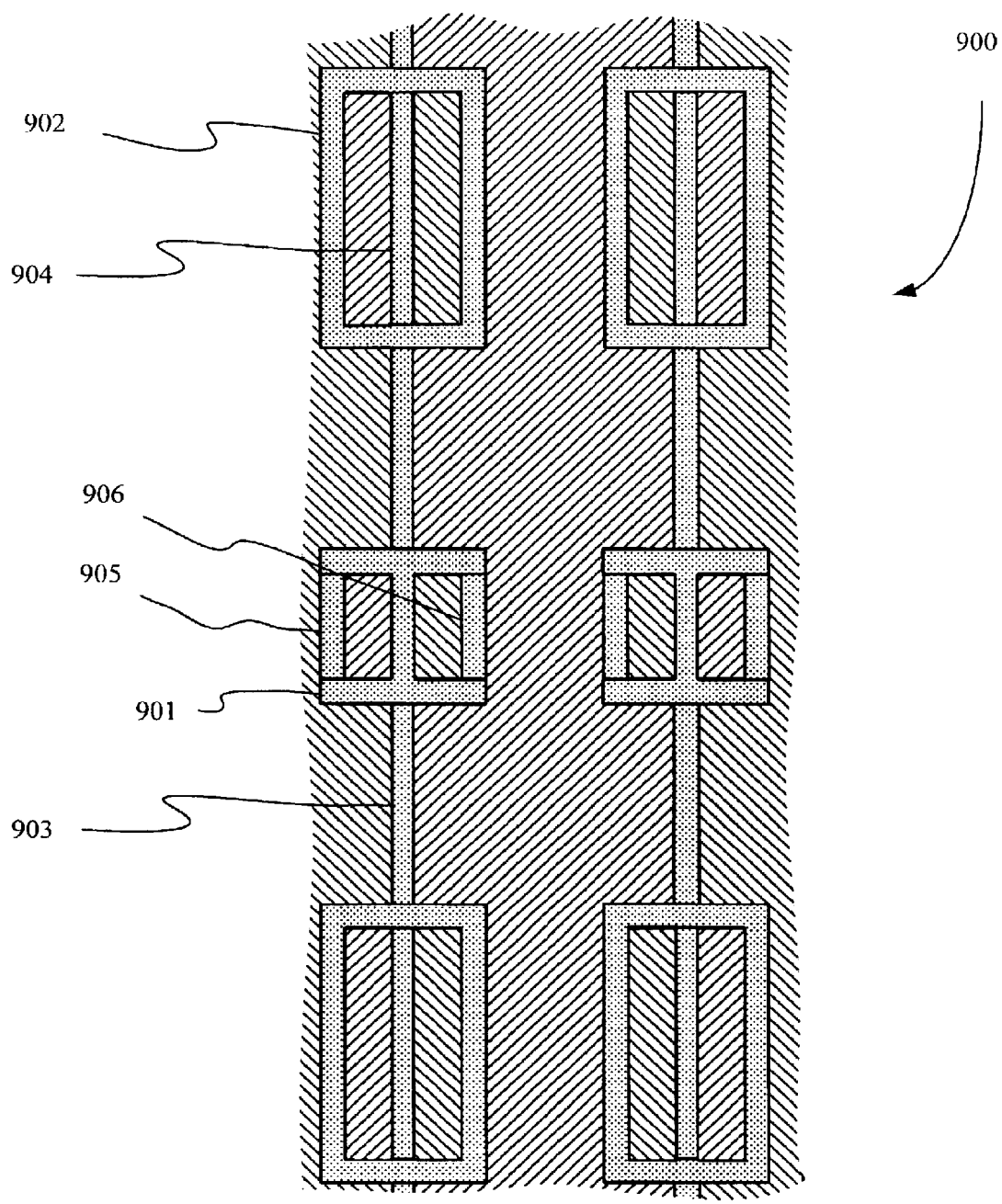
FIG. 9 illustrates an exemplary FPSM for defining the features of the active layer shown in FIG. 8.

FIG. 9 illustrates an exemplary FPSM 900 for defining the features of the active layer shown in FIG. 8 (for the portion 310 of FIG. 3). In one embodiment, to ensure that substantially all of the features (that is, both I's and O's) are defined using phase shifting, specific cut patterns can be used in FPSM 900. Also, the pattern can be sensitive to the locations of the corresponding gates and avoids placement of cuts proximate to those regions. For example, in defining the O's, shapes 902 (which correspond to features 802) can include cuts 904, which essentially divide shapes 902 substantially in half. This cut pattern facilitates defining substantially all feature edges with phase shifting. In defining the I's, shapes 901 (which correspond to features 801) can include cuts 905 and 906. Specifically, a cutting pattern for an I-shaped feature can include a first cut between two left-side line ends of horizontal bars of the I-shaped feature and a second cut between two right-side line ends of the horizontal bars. Note that cuts 905 and 906 allow the I's and O's to be phase shifted in a similar manner. Cuts 903 can be made between shapes 901 and 902 to facilitate phase assignment. Cuts 903, 904, 905, and 906 form artifacts, which should be removed from the active layer. Note that the outline of the original layout is shown in FIG. 9 for reference purposes only.

Figure 10:
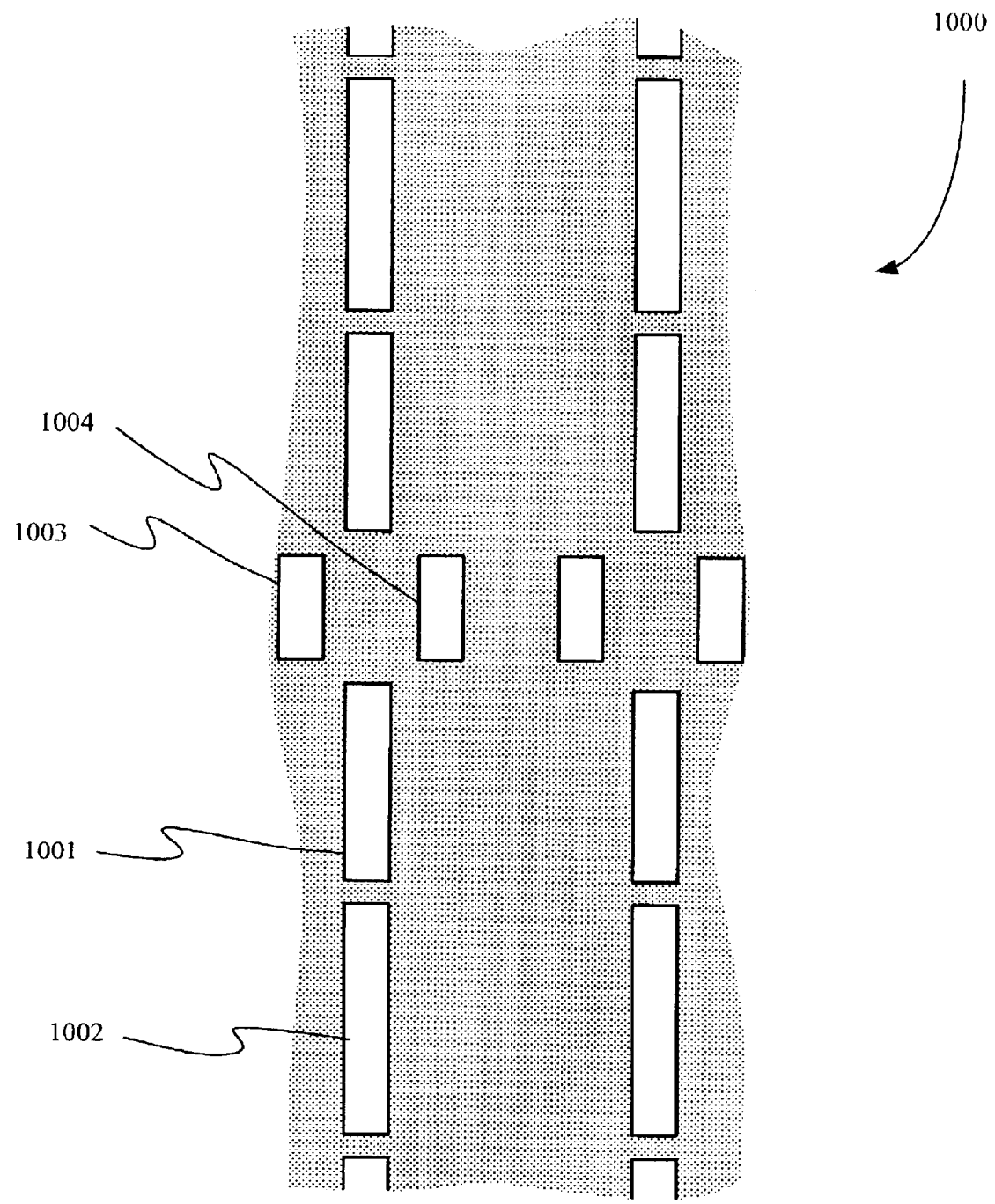
FIG. 10 illustrates an exemplary trim mask that can expose the artifacts created by the FPSM of FIG. 9.

FIG. 10 illustrates an exemplary trim mask 1000 that can expose these artifacts. Specifically, trim mask 1000 can include transparent regions 1001 to expose the artifacts corresponding to cuts 903, transparent regions 1002 to expose the artifacts corresponding to cuts 904, and transparent regions 1003 and 1004 to expose the artifacts corresponding to cuts 905 and 906.

Figure 11:
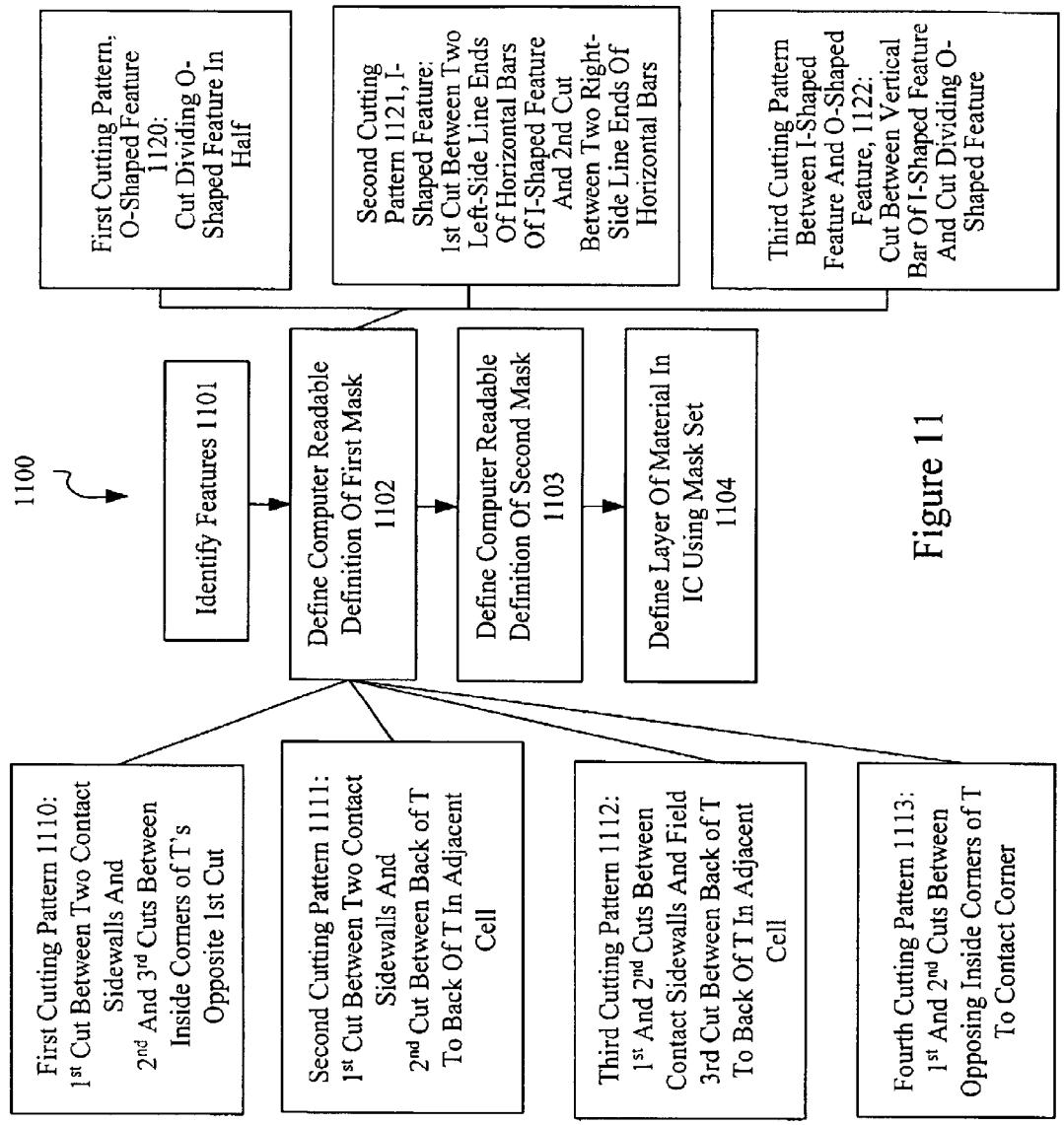
FIG. 11 illustrates a process for manufacturing an integrated circuit (IC) product using at least one of the cutting patterns.

FIG. 11 illustrates a process 1100 for manufacturing an integrated circuit (IC) product using at least one of the cutting patterns. In step 1101, a plurality of features in a description of a layer of material in the IC can be identified. In step 1102, a computer readable definition of a first mask can be defined. The first mask includes a plurality of shifters disposed on an opaque field. The shifters can be positioned such that destructive light interference between adjacent shifters defines substantially all of the plurality of features. Thus, the first mask can be characterized as a full phase shifting mask (FPSM). Of importance, the phase shifters can also be defined according one or more cutting patterns.

For an FPSM forming a polysilicon layer, at least one of four cut patterns can be selected. A first cutting pattern 1110 can include a first cut between two contact landing pads of each SRAM cell, and a second cut and a third cut on inside corners of a T of each SRAM cell opposite the first cut (see FIG. 4). A second cutting pattern 1111 can include a first cut between two contact landing pads of each SRAM cell and a second cut on the back of the T of each SRAM cell to the back of the T of an adjacent SRAM cell (see FIG. 5). A third cutting pattern 1112 can include a first cut and second cut from contact landing pads of the SRAM cell to a field area of the SRAM cell and a third cut on the back of the T of the SRAM cell to the back of the T of an adjacent SRAM (see FIG. 6). A fourth cutting pattern 1113 can include a first cut and a second cut in opposing inside corners of the T of each SRAM cell to a contact corner (see FIG. 7).

For an FPSM forming an active layer, three cutting patterns can be used. The first cutting pattern 1120 for an Oshaped feature can include a cut dividing the O-shaped feature in half. The second cutting pattern 1121 for an I-shaped feature can include a first cut between two left-side line ends of horizontal bars of the I-shaped feature and a second cut between two right-side line ends of the horizontal bars. The third cutting pattern 1122 between the I-shaped feature and the O-shaped feature can include a cut between a vertical bar of the I-shaped feature and the cut dividing the O-shaped feature.

In step 1103, a computer readable definition of a second mask can be defined. The second mask can include protective opaque regions on a clear field for protecting the pattern defined using the FPSM as well as clearing artifacts created by the FPSM and defines any remaining edges, portions of edges, or structures not defined by the first mask. Thus, the second mask can be characterized as a trim mask that corresponds to the FPSM. In step 1104, a layer of material in the IC can be defined using a mask set produced from the computer readable definition of the FPSM and the computer readable definition of the trim mask.

Although illustrative embodiments of the invention have been described in detail herein with reference to the accompanying figures, it is to be understood that the invention is not limited to those precise embodiments. They are not intended to be exhaustive or to limit the invention to the precise forms disclosed. As such, many modifications and variations will be apparent.

For example, although the description has primarily focused on examples of defining a polysilicon or active layer within an integrated circuit, the full phase shifting and cut pattern can be used to define other layers of material, e.g. interconnects, metal, etc. Moreover, although angled cuts are shown in the above embodiments, 90 degree cuts can be more easily manufactured. Accordingly, in some embodiments, cuts at 90 degrees to the features can be made where practical. This cutting angle works particularly well at outside corners where the angled cut can be modified to a straight line cut. Additionally, although the cut areas are shown as opaque regions, a gradual, e.g. continuous, phase transition can be used as can a tri- or quad-tone mask, e.g. 0–90–180 or 0–60–120–180, with the middle phase values used in the cut openings.

Some embodiments of the invention can include computer programs for performing the processes of defining the phase shifting layers and/or corresponding trim layers. In one embodiment, the process is implemented using the iN-Phase (TM) software licensed by Numerical Technologies, Inc. These computer programs can be stored in computer readable media, e.g. CD-ROM, DVD, etc., or embodied in an electromagnetic carrier wave. For example, the electromagnetic carrier wave may include the computer programs being accessed over a network.

As used herein, the term optical lithography refers processes that can include the use of visible, ultraviolet, deep ultraviolet, extreme ultraviolet, x-ray, and other radiation sources for lithography purposes. The masks designs used can be appropriately adapted, e.g. reflective vs. transmissive, etc., to the particular lithographic process. Therefore, it is intended that the scope of the invention be defined by the following claims.

What is claimed is:

1. A method for producing a computer readable definition of a photolithographic mask that defines a pattern in a layer to be formed using the mask, wherein the pattern includes a plurality of features corresponding to a plurality of static random access memory (SRAM) cells, an SRAM cell including two T's with off-centered lines opposing each other, the method comprising:

selecting at least one cutting pattern from a set of patterns including at least
(i) a first cutting pattern comprising a first cut between two contact landing pads of each SRAM cell, and a second cut and a third cut on inside corners of a T of each SRAM cell opposite the first cut,
(ii) a second cutting pattern comprising a first cut between two contact landing pads of each SRAM cell and a second cut on the back of the T of each SRAM cell to the back of the T of an adjacent SRAM cell, (iii) a third cutting pattern comprising a first cut and second cut from contact landing pads of the SRAM cell to a field area of the SRAM cell and a third cut on the back of the T of the SRAM cell to the back of the T of an adjacent SRAM, and (iv) a fourth cutting pattern comprising a first cut and a second cut in opposing inside corners of the T of each SRAM cell to a contact corner for use in defining the plurality of SRAM cells; and defining a plurality of shifters in the computer readable definition of the mask to substantially fully define the plurality of SRAM cells using destructive light interference, the plurality of shifters being separated by cuts according to the cutting pattern.

2. The method of claim 1, further comprising defining a computer readable definition of a second mask, the second mask comprising a complementary trim mask for use in conjunction with the first mask and for preserving structure defined by the first mask and clearing artifacts created by use of the first mask.

3. The method of claim 2, further comprising manufacturing a photolithographic mask set using the computer readable definition of the first mask and the computer readable definition of the second mask.

4. A method of manufacturing an integrated circuit product, the method comprising:

identifying a plurality of features in a description of a layer of material in the integrated circuit, a portion of the features forming T's with off-centered lines opposing each other;

defining a computer readable definition of a first mask, the first mask comprised of a plurality of shifters disposed on an opaque field, the phase shifters disposed such that destructive light interference between adjacent shifters defines substantially all of the plurality of features, wherein the plurality of the phase shifters are positioned according to cuts between locations in the pattern corresponding to one or more of contact landing pads to contact landing pads, back of T to back of T, contact corners to corners of T's, contact landing pads to field areas, and corners of T's to field areas;

defining a computer readable definition of a second mask, the second mask including protective opaque regions on a clear field for protecting the pattern defined using the first mask and clearing artifacts created by the first mask;

defining a layer of material in the integrated circuit using a mask set produced from the computer readable definition of the first mask and the computer readable definition of the second mask.

5. The method of claim 4, wherein the integrated circuit comprises an SRAM memory chip.

6. The method of claim 5, wherein the cuts are defined such that corresponding structures of different SRAM cells are consistently defined using a particular phase ordering.

7. The method of claim 6, wherein the cuts comprise at least one of contact landing pad to contact landing pad cuts and back of T to back of T cuts.

8. A photolithographic mask for defining a layer of material, the layer of material including a pattern, the pattern corresponding to a plurality of SRAM cells, an SRAM cell including two T's with off-centered lines opposing each other, the photolithographic mask comprising a dark field mask with a plurality of light transmissive phase shifting regions disposed therein, the disposition of the phase shifting regions such that destructive light interference between the light transmissive phase shifting regions defines the plurality of SRAM cells according to cuts between locations in the pattern corresponding to one or more of contact landing pads to contact landing pads, back of T to back of T, contact corners to corners of T's, contact landing pads to field areas, and corners of T's to field areas.

9. The mask of claim 8, wherein the mask defines a layer of material for an SRAM memory chip.

10. The mask of claim 8, wherein substantially all of the structure of each of the plurality of SRAM cells defined by the destructive interference is created by the positioning of the phase shifting regions.

11. An apparatus for creating a computer readable definition of a first mask, the apparatus comprising:

means for identifying features in a layout, a portion of the features forming T's with off-centered lines opposing each other;

means for defining a phase shifting region around the pattern, and means for dividing the phase shifting region into a plurality of shifters for defining the features such that the features are substantially defined using the plurality of shifters, the plurality of shifters being divided by a plurality of cuts between one or more locations, wherein the locations correspond to one or more of contact landing pads to contact landing pads, back of T to back of T, contact corners to corners of T's, contact landing pads to field areas, and corners of T's to field areas.

12. The apparatus of claim 11, wherein the first mask defines a layer of material for an SRAM memory chip.

13. The apparatus of claim 11, further comprising means for defining a computer readable definition of a second mask, the second mask for use in conjunction with the first mask to protect the pattern defined using the first mask and to clear artifacts created by the first mask.

14. A computer program for defining a mask layout, the computer program comprising:

a first set of instructions for identifying a plurality of features in a description of a layer of material in the integrated circuit, a portion of the features forming two T's with off-centered lines opposing each other;

a second set of instructions for defining a computer readable definition of a first mask, the first mask including a plurality of shifters disposed on an opaque field, the shifters positioned such that destructive light interference between adjacent shifters substantially defines the plurality of features, the shifters further positioned according to cuts between locations in the pattern corresponding to one or more of contact landing pads to contact landing pads, backs of T's to backs of T's, contact corners to corners of T's, contact landing pads to field areas, and corners of T's to field areas;

a third set of instructions for defining a computer readable definition of a second mask, the second mask including protective opaque regions on a clear field for protecting the pattern defined using the first mask and clearing artifacts created by the first mask;

a fourth set of instructions for defining a layer of material in the integrated circuit using a mask set produced from the computer readable definition of the first mask and the computer readable definition of the second mask.

15. A method for producing a computer readable definition of a photolithographic mask that defines a plurality of features in a layer to be formed using the mask, wherein the plurality of features correspond to a plurality of active regions, the method comprising:

providing a first cutting pattern for an O-shaped feature, the first cutting pattern comprising a cut dividing the O-shaped feature in half;

providing a second cutting pattern for an I-shaped feature, the second cutting pattern comprising a first cut between two left-side line ends of horizontal bars of the I-shaped feature and a second cut between two right-side line ends of the horizontal bars;

providing a third cutting pattern between the I-shaped feature and the O-shaped feature, the third cutting pattern comprising a cut between a vertical bar of the I-shaped feature and the cut dividing the O-shaped feature; and defining a plurality of shifters in the computer readable definition of the mask to substantially fully define the plurality of active regions using destructive light interference, the plurality of shifters being separated by cuts according to the first, second, and third cutting patterns.

16. The method of claim 15, further comprising defining a computer readable definition of a second mask, the second mask comprising a complementary trim mask for use in conjunction with the first mask and for preserving structure defined by the first mask and clearing artifacts created by use of the first mask.

17. A photolithographic mask for defining a layer of material, the layer of material including a plurality of active regions, the photolithographic mask comprising a dark field mask with a plurality of light transmissive phase shifting regions disposed therein, the disposition of the phase shifting regions such that destructive light interference between the light transmissive phase shifting regions defines the plurality of active regions according to:

a first cutting pattern for an O-shaped active region, the first cutting pattern comprising a cut dividing the O-shaped active region in half;

a second cutting pattern for an I-shaped active region, the second cutting pattern comprising a first cut between two left-side line ends of horizontal bars of the I-shaped active region and a second cut between two right-side line ends of the horizontal bars; and a third cutting pattern between the I-shaped active region and the O-shaped active region, the third cutting pattern comprising a cut between a vertical bar of the I-shaped active region and the cut dividing the O-shaped active region.

18. The mask of claim 17, wherein the mask defines a layer of material for an SRAM memory chip.

19. The mask of claim 17, wherein substantially all of the structure of each of the plurality of active regions defined by the destructive interference is created by the positioning of the phase shifting regions.

20. A computer software program for producing a computer readable definition of a first mask, the first mask defining a pattern in a layer, wherein the pattern includes a plurality of features corresponding to a plurality of static random access memory (SRAM) cells, an SRAM cell including two T's with off-centered lines opposing each other, the computer software program comprising:

code for selecting at least one cutting pattern from a set of patterns including:

(i) a first cutting pattern comprising a first cut between two contact landing pads of each SRAM cell, and a second cut and a third cut on inside corners of a T of each SRAM cell opposite the first cut, (ii) a second cutting pattern comprising a first cut between two contact landing pads of each SRAM cell and a second cut on the back of the T of each SRAM cell to the back of the T of an adjacent SRAM cell, (iii) a third cutting pattern comprising a first cut and second cut from contact landing pads of the SRAM cell to a field area of the SRAM cell and a third cut on the back of the T of the SRAM cell to the back of the T of an adjacent SRAM, and (iv) a fourth cutting pattern comprising a first cut and a second cut in opposing inside corners of the T of each SRAM cell to a contact corner for use in defining the plurality of SRAM cells; and code for defining a plurality of shifters in the computer readable definition of the first mask to substantially fully define the plurality of SRAM cells using destructive light interference, the plurality of shifters being separated by cuts according to the cutting pattern.

21. The computer software program of claim 20, further comprising code for defining a computer readable definition of a second mask, the second mask comprising a complementary trim mask for use in conjunction with the first mask and for preserving structure defined by the first mask and clearing artifacts created by use of the first mask.

22. The computer software program of claim 21, further comprising code for manufacturing a photolithographic mask set using the computer readable definition of the first mask and the computer readable definition of the second mask.

* * * * *